United States Patent [19]
Kelly et al.

[11] 3,938,722
[45] Feb. 17, 1976

[54] ULTRASONIC THERMAL COMPRESSION BEAM LEAD, FLIP CHIP BONDER

[75] Inventors: James E. Kelly, Melrose; Richard F. Foulke, Carlisly; Raymond T. Fitzsimmons, Lexington, all of Mass.

[73] Assignee: Mech-El Industries, Inc., Woburn, Mass.

[22] Filed: Apr. 30, 1973

[21] Appl. No.: 355,889

[52] U.S. Cl. .................. 228/1; 228/4.1; 228/6; 228/29; 228/32; 228/110; 228/237
[51] Int. Cl.² .................................. B23K 21/02
[58] Field of Search .......... 228/1, 4, 6, 29, 32; 29/470.1, 471.1, 493

[56] References Cited
UNITED STATES PATENTS

| | | | |
|---|---|---|---|
| 3,505,726 | 4/1970 | Klienedler et al. | 29/470.1 |
| 3,575,333 | 4/1971 | Kulicke, Jr. et al. | 228/1 |
| 3,700,156 | 10/1972 | Hermanns | 228/4 |
| 3,747,829 | 7/1973 | Hofmeister | 228/32 X |

FOREIGN PATENTS OR APPLICATIONS

| 238,261 | 2/1965 | Austria | 228/6 |
|---|---|---|---|

Primary Examiner—Francis S. Husar
Assistant Examiner—Gus T. Hampilos
Attorney, Agent, or Firm—James J. Cannon, Jr.

[57] ABSTRACT

An apparatus for bonding beam lead devices and flip chip devices onto mating conductive surfaces on a substrate or other surface and for bonding electrical leads to semiconductor devices and subsequently to mating conductive surfaces on a substrate or other surface, utilizing either thermocompression or ultrasonic energy. The bonding system of this disclosure includes a novel bonding tool having minute spherically shaped bonding surfaces which are caused by a novel pivoting mechanism to individually and successively bond each of a plurality of electrical leads in a complex wobbling motion which permits the bonding surfaces to trace an adjustable rectangular or other predetermined linear path around the periphery of the device. The system also includes a frequency modulated ultrasonic generator and a novel lead composite, developed for this apparatus.

10 Claims, 16 Drawing Figures

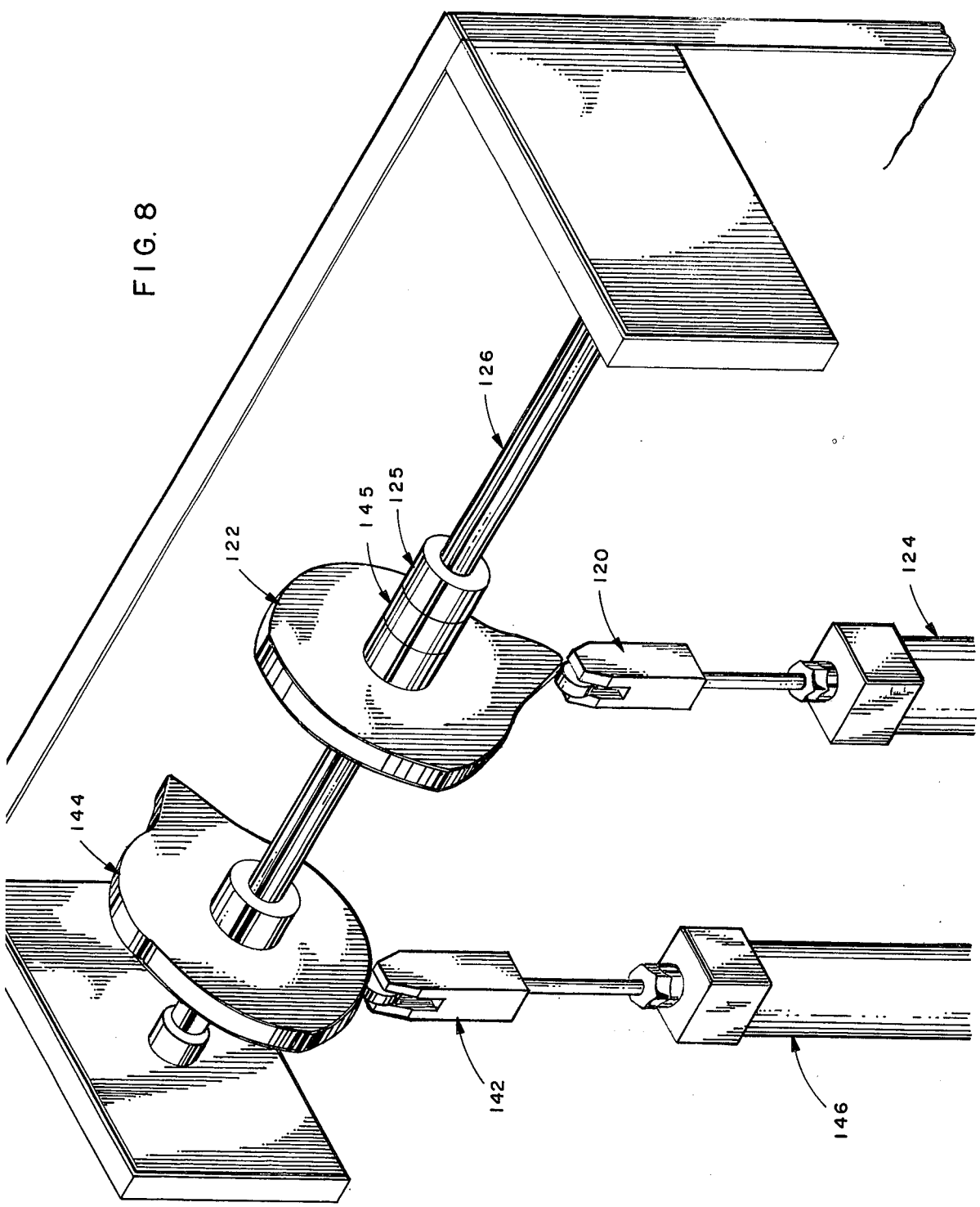

ULTRASONIC THERMAL COMPRESSION BEAM LEAD, FLIP CHIP BONDER

BACKGROUND OF THE INVENTION

1. Field of the Invention

The system of this invention pertains to an improved apparatus and method for bonding beam lead devices and flip chip devices onto mating conductive surfaces on a substrate or other surface and for bonding electrical leads onto semiconductor devices and subsequently bonding said leads onto mating conductive surfaces on a substrate or other surface, utilizing either ultrasonic or thermocompression energy. The bonder of this invention utilizes a novel bonding tool having minute spherically shaped bonding surfaces which are caused to individually and successively contact and bond each of a plurality of electrical leads projecting from the periphery of a beam leaded device onto a substrate. A novel pivoting mechanism is disclosed for causing a complex wobbling motion of the bonding tool so that the tool follows an adjustable rectangular or other predetermined linear path around the periphery of the device to produce the desired individual and successive bonding of the leads. In the ultrasonic configuration, a novel frequency-modulated ultrasonic generator insures that the correct amount of ultrasonic energy is applied to each bond and that the system is always in resonance. A novel composite will also be disclosed in a related application which enables the system of this invention to bond electrical leads to a semiconductor device as well as bond them to a substrate or other surface having conductive patterns.

2. Description of the Prior Art

There are three presently used techinques of beam lead bonding. One is called a tacking technique which can utilize either thermocompression or ultrasonic energy. In this technique one lead at a time is put down and bonded with a tacking probe.

The second technique is called wobble bonding. There are presently three known variations of wobble bonding. One utilizes a wobble bonder such as that disclosed in U.S. Pat. No. 3,575,333. This patent discloses a thermocompression bonding tool mounted in a housing and pivoted about a focal point at the working surface to engage sequentially the electrical leads. The wobbling movement is generally in a conical or eliptical fashion and the bonding tool generally has a flat bonding surface but sometimes uses a slightly rounded tool. However, in practice, this type of wobble bonder is limited to thermocompression energy. It uses heat on the tool and heat on the work station. The pivot point of this tool is in axial alignment with the longitudinal axis of the bonding tool and in practice cannot be adapted to ultrasonic bonding.

A second variation of wobble bonding is disclosed in U.S. Pat. No. 3,700,156 in which an ultrasonic wobble bonder is disclosed. In this wobble bonder, the tool holder which transmits ultrasonic energy is pivotally mounted in radial fashion, that is, the longitudinal axis of the tool is perpendicular to the longitudinal axis of the tool holder. In this system the ultrasonic transducer as well as the bonding tool is wobbled.

A third variation of wobble bonding is achieved by wobbling the work table rather than the bonding tool. Within the wobble table systems there are two variations. In one the table is wobbled to bring each lead into sequential contact with the bonding tool, as disclosed in U.S. Pat. No. 3,672,034. In the other, the table is wobbled to a position such that the beam leads are planar relative to the bonding tool. The tool is then lowered and all leads are bonded simultaneously. A recent patent disclosing this technique is U.S. Pat. No. 3,475,814. This variation is not a true wobble bonding system, but is mentioned here because some wobbling of the table is necessary to achieve the desired result.

The third principal technique of beam lead bonding is compliant bonding. In compliant bonding, the bonding tool is kept planar relative to the substrate. A compliant material, such as soft aluminum, is placed between the tool and the beam leads. The purpose of this material is to equalize the pressure on the leads since they are usually all bonded at one time.

Each of the bonding systems and techniques disclosed in the prior art has its own advantages and disadvantages. The bonding system of the present invention is a complex machine utilizing a variety of novel features which both overcome the disadvantages of the units disclosed in the prior art and combine their many advantages in one system. The system of the present invention is a significant improvement over U.S. Pat. No. 3,700,156 owned by the same assignee.

The system of the present invention is the first commercially available wobble bonder of the wobbling tool variety in which the wobble movement does not describe merely a conical or eliptical path around the periphery of a beam lead or other semi-conductor device. Whether a beam lead or other device is square or rectangular in shape, prior wobble bonders trace a conical or an eliptical path around its periphery and thus bond some leads closer to the device than others or bond with varying pressure or direction of force. This can result in an uneven bonding pattern, undesirable electrical characteristics in the circuit and an occasional missed bond. The system of the present invention, however, enables the bonding tool to wobble in a straight line along the x-axis and the y-axis a predetermined distance from the edge perimeters and parallel to the edge perimeters of the device, or in any other desired linear path, and even on the surface of the device. Hence, the tool of the present invention does not wobble in the traditional sense. Its motion might better be described as a rocking motion and the bonder should be termed a rocker bonder.

There are three novel factors which contribute to this unique wobble or rocker motion and which distinguish the system of the present invention from the prior art. First, this system utilizes the design disclosed in U.S. Pat. No. 3,700,156 in which the longitudinal axis of the bonding tool is perpendicular to the longitudinal axis of the tool holder. This is the only design known in the present art which permits the use of ultrasonic energy in a bonder having a wobbling tool. However, in the present invention, the wobbling mechanism is improved to permit the tool to follow a rectangular rather than an eliptical path. The second novel factor contributing to the rocker bonder is the bonding tool itself. The prior art discloses in U.S. Pat. No. 3,505,726 a rounded bonding tool which minimizes the lateral forces applied to a beam when rocking over the leads. However, the design of the tool is such that it can bond only one of four sides at a time and then must be re-set. The bonding surfaces on the tip of the bonding tool of the present invention are four minute sections of a sphere disposed about the periphery of the tool which are utilized sequentially in wobbling or rocking around the periphery of a beam lead device. Other bonding tools of more conventional designs may be utilized with the system of the present invention, but this novel design yields significantly improved results. The third novel factor is that the speed of the bonding tool over a given direction can be varied so that each lead receives the same amount of bonding energy. This speed can be a function of the number of leads to be bonded along a perimeter of the device. Thus the present invention marks a significant improvement over the prior art.

In addition to the above points of novelty, the wobble bonding system of the present invention permits the bonding of lead composites to semiconductor devices as well as to a substrate or other surface having conductive patterns. This is made possible by the novel rectilinear motion of the bonding tool, the precise control of tip pressure on the leads and the precise control of the bonding energy.

To bond the lead composites both to the device and to a substrate or surface requires two trips of the tool around the periphery of the device, bonding the leads to the device on the first and the leads to the substrate on the second.

The wobble bonding system of the present invention also includes a frequency modulated ultrasonic generator incorporating an added saw tooth sweep or other function generator wherein the center frequency is modulated by the use of a saw tooth sweep generator; and the saw tooth sweep generator combined with adjustable speeds for wobbling the bonding tool around the perimeter of the device, permits the system to achieve more uniform bonds over the entire range of leads through an even distribution and control of the ultrasonic energy.

In addition to combining the aforesaid advantages of prior machines, the bonding system of the present invention may be utilized as a compliant bonder and as a flip chip bonder by reducing the pivotal movement of the bonding tool on its x- and y-axes to 0, 0.

The bonding system of the present invention also permits the bonding of a variety of metals directly to a semiconductor chip either ultrasonically or by thermocompression through the utilization of novel beam and lead composites.

SUMMARY OF THE INVENTION

An apparatus for bonding beam lead devices and flip chip devices onto mating conductive surfaces on a substrate or other surface and for bonding electrical leads to semiconductor devices and subsequently to mating conductive surfaces on a substrate or other surface, utilizing either thermocompression or ultrasonic energy. The system comprises a bonding mechanism, commonly known as a wobble bonder, including a bonding tool having minute spherically shaped bonding surfaces, beam and lead composites which enable the system to effect types of bonds not hitherto possible and, for ultrasonic bonding, a frequency modulated ultrasonic generator incorporating a saw tooth sweep generator to control and distribute evenly the ultrasonic energy to each bond. The system of the present invention may be utilized as a beam lead bonder, a flip chip bonder and a compliant bonder.

The system of the present invention can bond beam lead devices ranging in dimension from 15 mils long on the shortest side to 200 mils long on the longest side. Utilizing thermocompression as the source of bonding energy, the heat applied to the substrate ranges from 25° C to 500° C and to the bonding tool from 25° C to 450° C. The weight applied to the bond can range from 0 to 3,000 grams. The wobble angle of the bonding tool is independently adjustable for each axis and can vary up to 20° from the vertical axis. It can lock at 0°; 0° for die mounting, flip chip bonding or compliant bonding. The time to wobble around a beam lead device can vary from ¼ second to 4 seconds. Utilizing ultrasonic energy for bonding, the system requires an ultrasonic generator of 25 watts power, 60 KHz adjustable for C.W. or F.M.

The system of the present invention includes a novel bonding tool having a cylindrical vertical shaft with an opening therethrough for a vacuum line, a generally cubical-shaped bonding head having a hollow recess in the base thereof for pick-up and placement of semiconductor devices, dice or chips, and bonding surfaces disposed about the periphery of said recess. Said bonding surfaces are four minute spherical sections, which enable said bonding head to wobble or rock over the leads to be bonded.

In order to rock these bonding surfaces in an adjustable rectangular or other predetermined linear path around the periphery of a beam lead or other device, the bonding tool is inserted in a tool holder which is attached to the movable plate of a vertical ball slide mounted on a gimbal mechanism. This gimbal mechanism includes a fixed outer gimbal frame, a middle gimbal frame which is pivotally attached to the outer frame along its y-axis and an inner gimbal frame pivotally attached to the middle gimbal frame along its x-axis. The bonding tool housing itself is mounted on the inner gimbal frame. A precise pivoting of the two inner gimbal frames about a center point combined with the slidably mounted tool holder will produce the desired rectangular wobble motion of the bonding head.

To achieve the desired motion of the gimbal frames, the underside of each frame is pivotally connected to a vertical shaft which is, in turn, pivotally connected to a horizontal shaft passing through an adjustable pivot block. The other end of the horizontal shaft is pivotally connected to the vertical shaft of a cam follower. Each cam follower is driven by a cam on the same motor shaft. These cams are constant velocity cams which are ninety degrees out of phase to coordinate the pivoting of the two inner gimbal frames to produce the desired motion. The motor driving the cam shaft is a variable speed motor having an automatic speed switch to adjust the speed of the tool so that each lead receives the same amount of ultrasonic energy. This system enables the bonding tool to move in any prescribed and adjustable geometric pattern by using appropriately shaped cams. In the present embodiment it is not necessary to change cams to adjust the dimensions of a rectangular path.

To complement the system, a frequency-modulated ultrasonic generator with an added saw tooth wave generator is provided to keep the system in resonance at all times and to insure an even application of ultrasonic energy to all bonds.

Additionally, a unique lead composite, which will be the subject of a subsequent application, is provided which serves two functions. It enables the electrical leads to be bonded to a semiconductor device itself in one pass of the tool around the periphery of the device. In a second pass, the leads are then bonded to a substrate or other surface having conductive patterns. The second purpose it serves, in conjunction with the other unique or novel elements of the system, is to permit the use of various metals and various types of lead structures for packaging semiconductor devices.

The bonding system of this invention permits extremely low bonding pressure with reasonable amounts of ultrasonic energy and an F.M. controlled resonance system, thus producing consistent reliable bonds without heat.

Bonds can be made to silicon chips with pressures below 100 grams using aluminum, gold or other metals and no heat.

Accordingly, it is a principal object of the present invention to provide a wobble bonding system for successive and sequential bonding of electrical leads of a beam lead device to a substrate or to contact pads on a semiconductor device utilizing either ultrasonic or thermocompression energy.

It is a further object of this invention to provide a bonding tool for said bonder which will wobble or rock over said leads while bonding them uniformly while minimizing lateral displacement of the leads from the contact points.

It is a further object of this invention to provide the mechanical means to wobble or rock said bonding tool around the periphery of said beam lead devices in a manner which will describe an adjustable rectangular or other predetermined linear path.

It is a further object of said invention to provide a frequencymodulated ultrasonic generator which will keep the system in resonance and produce constant, reliable bonds on each lead.

It is still a further object of this invention to provide a lead composite to enable the bonder of this invention to bond electrical leads onto semiconductor devices as well as bond the leads to a substrate or other surface having conductive patterns.

It is still a further object of this invention to provide an ultrasonic/thermocompression beam lead flip chip bonder which can be used for die bonding and compliant bonding as well.

Further object, features, and advantages of the system of this invention will become apparent from the specification read in conjunction with the drawings.

BRIEF DESCRIPTION OF THE DRAWINGS

FIG. 8 is a schematic illustration of the cam and cam follower system which cause the gimbal to produce a wobble motion.

FIG. 11a is a side view of the gimbal illustrating in dotted lines a frame in pivoted positions.

DESCRIPTION OF THE PREFERRED EMBODIMENT

Figure 5:
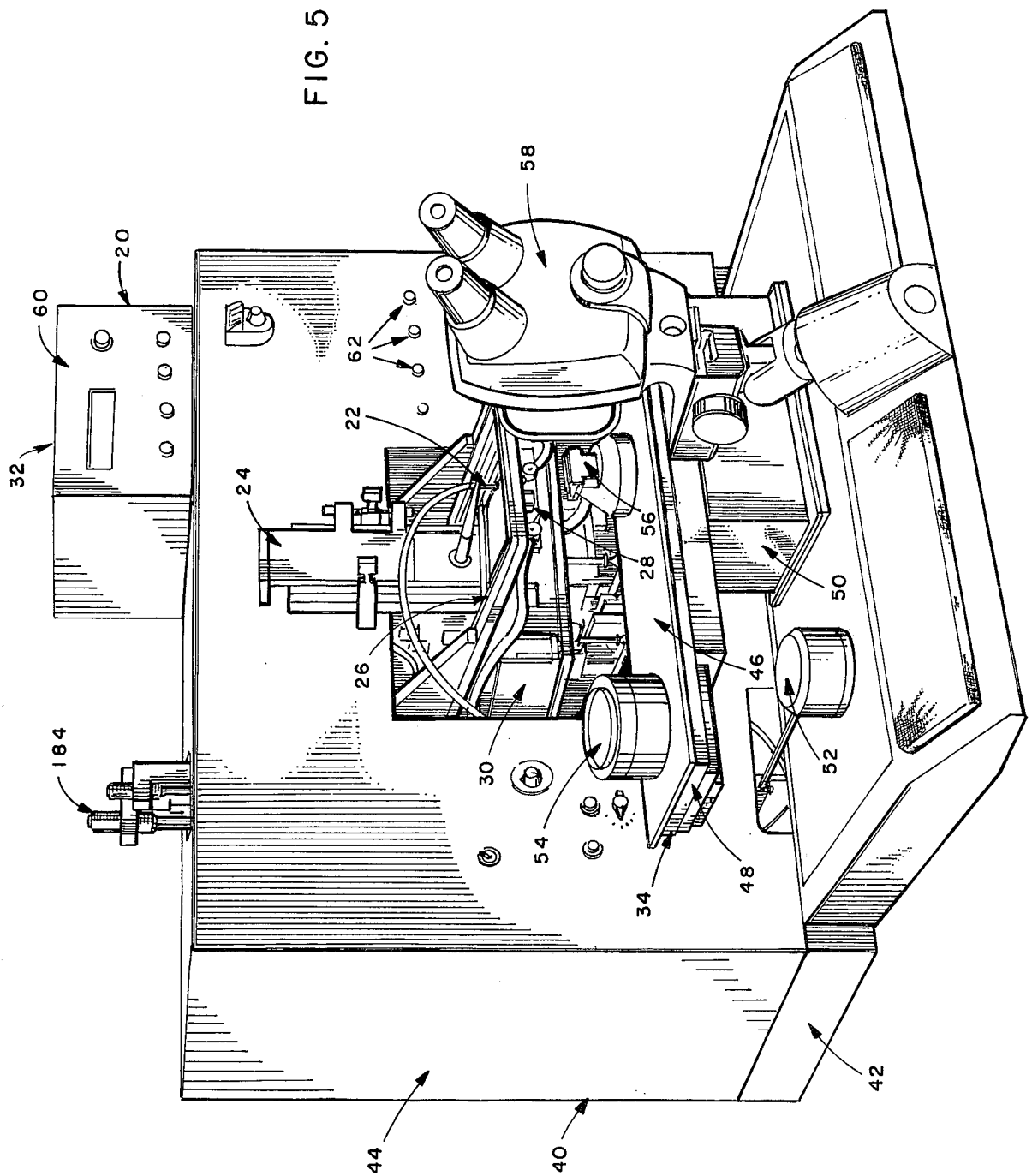
FIG. 5 is a front perspective view of a bonding tool which may be utilized in the system illustrated in FIG. 1.

Referring now to the drawings and, in particular to FIG. 5 wherein there is illustrated a front perspective view of the ultrasonic/thermocompression beam lead, flip chip bonding system of the present invention, the reference numeral 20 denotes generally the bonding system of the present invention. This bonding system 20 comprises a number of novel components and subsystems, each of which will be described subsequently including the bonding tool 22, the mounting system for the bonding tool 24, the wobble drive system 26, the optical system 28, the mechanical drive system 30, the ultrasonic system 32 and the work station system 34.

Bonding system 20 is mounted in a housing 40 comprising a lower housing member 42 and an upper housing member 44. Lower housing member 42 contains the basic electrical and air systems (not shown) of bonding system 20 and serves as a mounting base for the balance of bonding system 20. Mounted on the top front of lower housing unit 42 is the conventional work station system 34 comprising a work table 46 slidably mounted in roller slide 48 which is movably mounted on a conventional ball slide assembly 50. The surface of work table 46 is capable of movement along both the x- and y-axes, with gross movement by hand and precise movement controlled by a conventional micro-positioner 52. A conventional vacuum lock system (not shown) is provided to lock work table 46 into the desired position. Work table 46 serves as a positioning surface for die dish 54 and work station 56. Various types of work stations 56 may be mounted on work table 46, depending on the types of substrates or packages used for the beam lead or flip chip devices being bonded. Work station 56 may also be locked into a precise position by a conventional vacuum locking means (not shown).

Bonding tool 22, its mounting system 24, its wobble drive system 26, and the illuminated portion of the optical system 28 must all be lowered to and raised from work station 56. Hence these subsystems are all connected to mechanical drive system 30 which is mounted on the top rear surface of lower housing member 42 and enclosed within upper housing member 44. Microscope 58 is mounted on the front of lower housing unit 42 for full vision of work station 56. The ultrasonic generator 60 is mounted on top of upper housing unit 44. Operator controls 62 are mounted on the front panel of upper housing unit 44.

Figure 1:
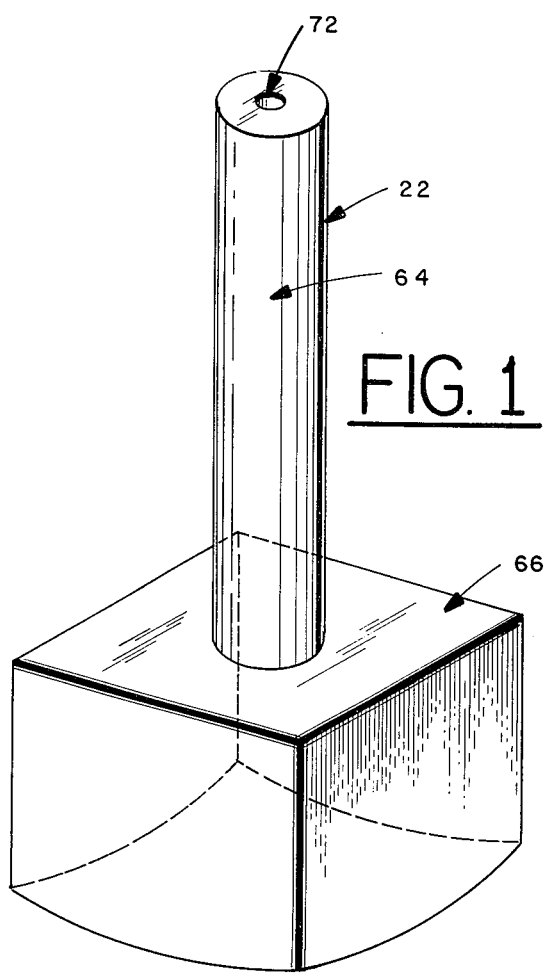
FIG. 1 is a front perspective view of the bonding tool used in the bonder of this invention.
Figure 3:
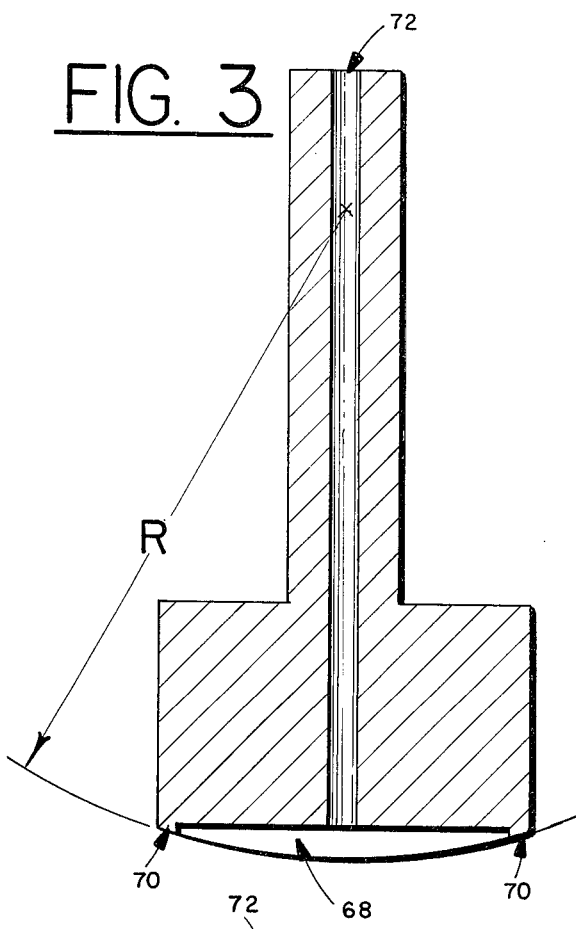
FIG. 3 is a vertical cross-sectional view of the bonding tool illustrated in FIG. 1, taken along the lines 4—4 of FIG. 3.
Figure 2:
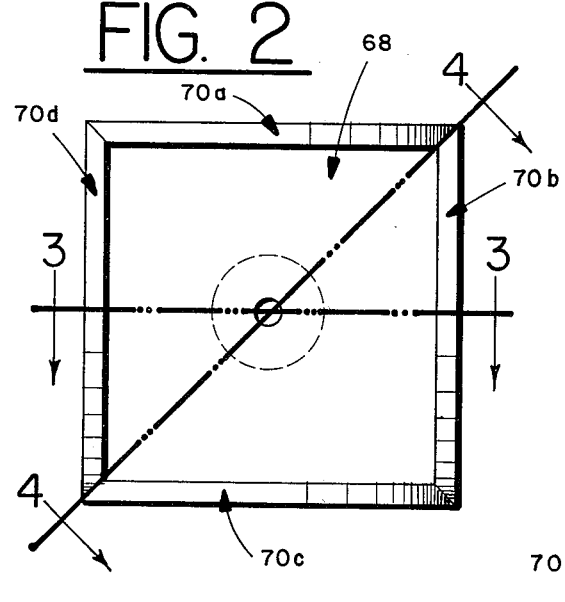
FIG. 2 is a bottom view of the bonding tool of FIG. 1.
Figure 4:
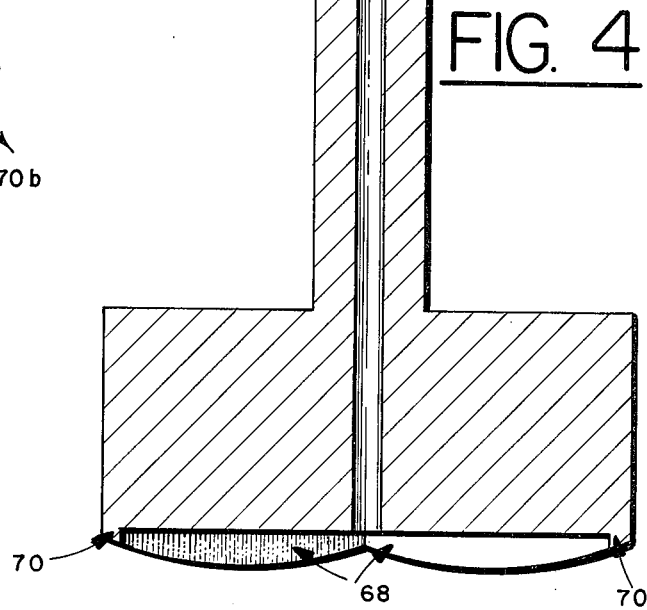
FIG. 4 is a diagonal cross-sectional view of the bonding tool of FIG. 1, taken along the lines 4—4 of FIG. 2.
Figure 14:
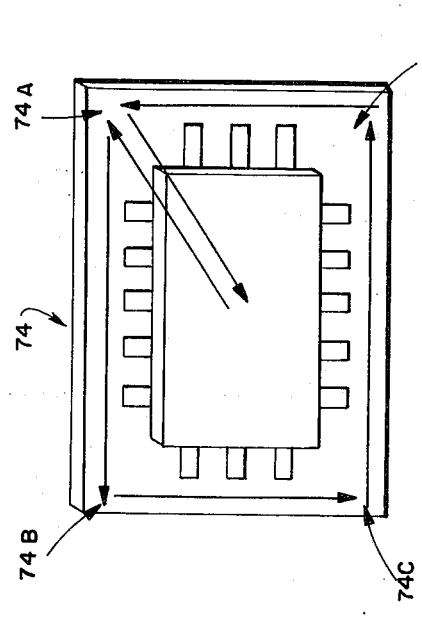
FIG. 14 is a top view of a beam lead device with a representation of the movement of the bonding tool over the leads.

Returning now to the various subsystems which contribute to the novelty of bonding system 20, FIGS. 1 through 4 illustrate the bonding tool 22 of the present invention. Bonding tool 22 includes a cylindrical shaft 64 and a bonding head 66. As illustrated in FIG. 2, the bottom end portion of head 66 includes a hollow recess 68 and four bonding surfaces 70 a–d substantially disposed around the periphery of recess 68. Bonding tool 22 also contains a hollow cylindrical column 72 from top to bottom, the top of which is attached to a vacuum line, not illustrated. In operation bonding tool 22 is lowered over a beam lead or other type device such that recess 68 fits over the deivce and, if used for die pick-up and mounting, the device may be held in recess 68 by a vacuum. Bonding energy is applied through bonding surfaces 70 a–d to the leads of the device and to mating conductive surfaces on a substrate. Two major factors contribute to the improved results. The bonding surfaces 70 a–d are each minute sections of a spherical surface whose radius R is illustrated in FIG. 3. In the present embodiment this radius ranges from ⅝ to 1¼ inches. These surfaces 70 a–d are moved by wobble drive system 26 in a complex wobbling fashion such that the bonding of individual electrical leads located beneath the bonding surfaces is effected in a rapid but definitely sequential manner as illustrated in FIG. 14. Since there are usually leads to be bonded on each of four sides of a device, bonding tool 22 must be rocked such that a single bonding surface, for example, surface 70-a rocks over the leads on one side, while the other three bonding surfaces 70 b–d remain relatively out of contact with the electrical leads. Referring to FIG. 14, bonding tool 22 is rocked to a corner 74a of a beam lead device 74 such that a corner of bonding surface 70a is closest to a corner of the beam lead device 74 and the appropriate section of the mating substrate. At this point the bonding tool 22 is rocked such that bonding surfaces 70 b–d remain relatively out of contact with any of the electrical leads, while the surface along side 70a is continuously lowered against the leads such that a point of bonding contact progressively moves from corner 74a to corner 74b, bonding the leads successively as bonding surface 70a rocks along a straight line equidistant from the periphery of the beam lead device 74. If the tool is likewise rocked from corner 74b to 74c, then from corner 74c to corner 74d and from corner 74d back to the starting position 74a, it will be seen that a plurality of leads will be bonded individually, successively and sequentially by bonding surfaces 70b thru 70d in that respective order. Since substantially only one lead is bonded at a time, and since the pressure on bonding tool 22, the time on the lead and the energy applied can be adjusted by an operator control, as will hereinafter be described, substantially more uniform bonds are effected for each of the separate leads.

The bonding tool 22 just described is only one of many designs which will function in bonding system 20. Conventional tools having flat bonding surfaces may also be utilized, but the bonds produced by such conventional tools may not be as consistent and uniform as those produced by bonding tool 22, illustrated in FIG. 12.

Figure 12:
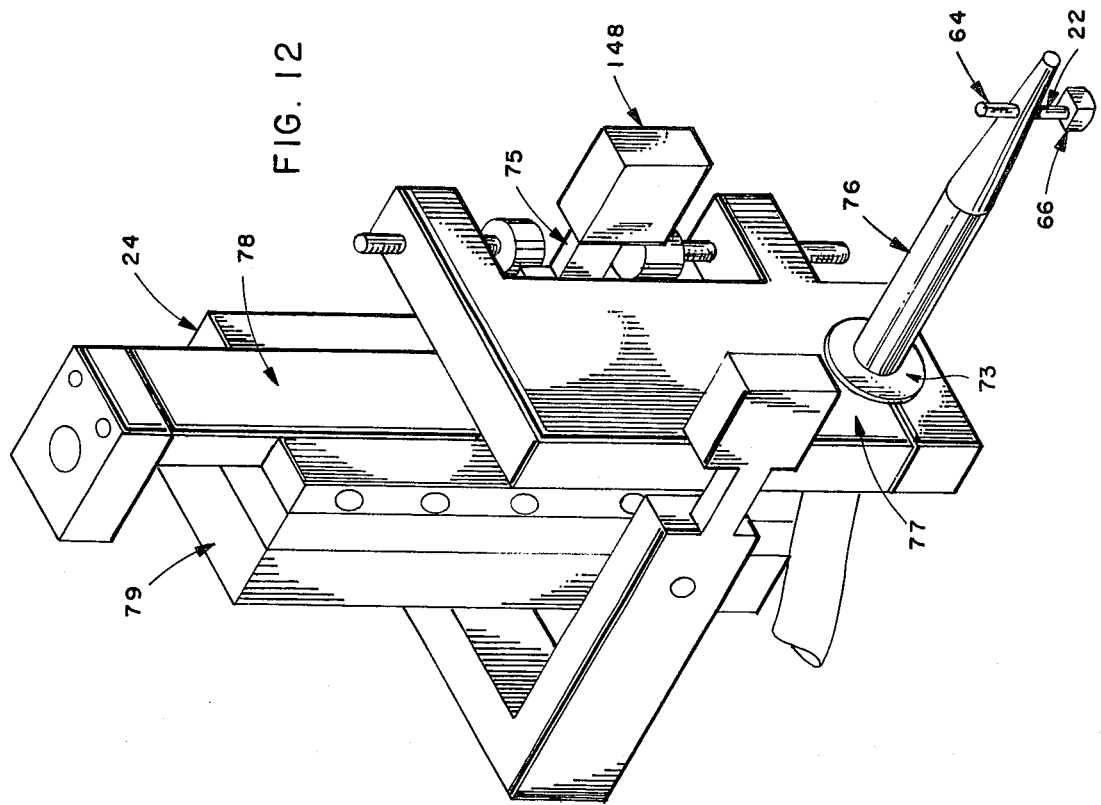
FIG. 12 is a side perspective view of the bonding tool holder of the present invention.

The tool mounting system 24 illustrated in FIG. 12, for bonding tool 22 comprises a cylindrically shaped tool holder 76, tapering slightly towards its front end, from which bonding tool 22 is suspended by its shaft 64 such that the longitudinal axis of bonding tool 22 is perpendicular to the longitudinal axis of tool holder 76. Means (not shown) are provided to adjust the height of tool 22 depending on the radius R of the sphere of bonding surfaces 70 a–d, the center of said sphere being centered in tool holder 76. Tool holder 76 is horizontally mounted through vertical support member 77 approximately midway along its longitudinal axis such that bonding tool 22 is forward of vertical support member 77 and its longitudinal axis is perpendicular to work surface 56. Tool holder 76 also serves as a means for the transmission of bonding energy from the energy source to the bonding surfaces 70 a–d on bonding tool 22.

For purposes of simplification, the subsequent description of the preferred embodiment will be restricted to the configuration of bonding system 20 utilizing ultrasonic energy, though it should be understood that bonding system 20 is easily configured to work as well with thermocompression energy.

In the ultrasonic configuration, tool holder 76 serves as a transducer horn and has a transducer 73 mounted on the end opposite from bonding tool 22 and substantially behind vertical support member 77. Vertical support member 77 is mounted to the movable plate of a vertically oriented, low friction ball slide 78 whose fixed plate is mounted to a second vertical support member 79 which is standing on two legs to permit the transducer 73 to protrude through. Support member 79 is mounted on the rear perimeter of an inner gimbal frame, which is an integral part of the wobble drive system 26, about to be described. A weighting system 75 is pivotally mounted to the top section of ball slide 78 to adjust the pressure of bonding tool 22 on a work surface from 0 to 3,000 grams. Bonding tool 22 is suspended from tool holder 76 such that bonding surfaces 70 a–d will center about the mid-point of the inner gimbal as described below.

As can be seen from this description, a rocking or wobbling of bonding tool 22 will also cause a rocking or wobbling of tool holder (transducer horn) 76 and the transducer 73.

Figure 6:
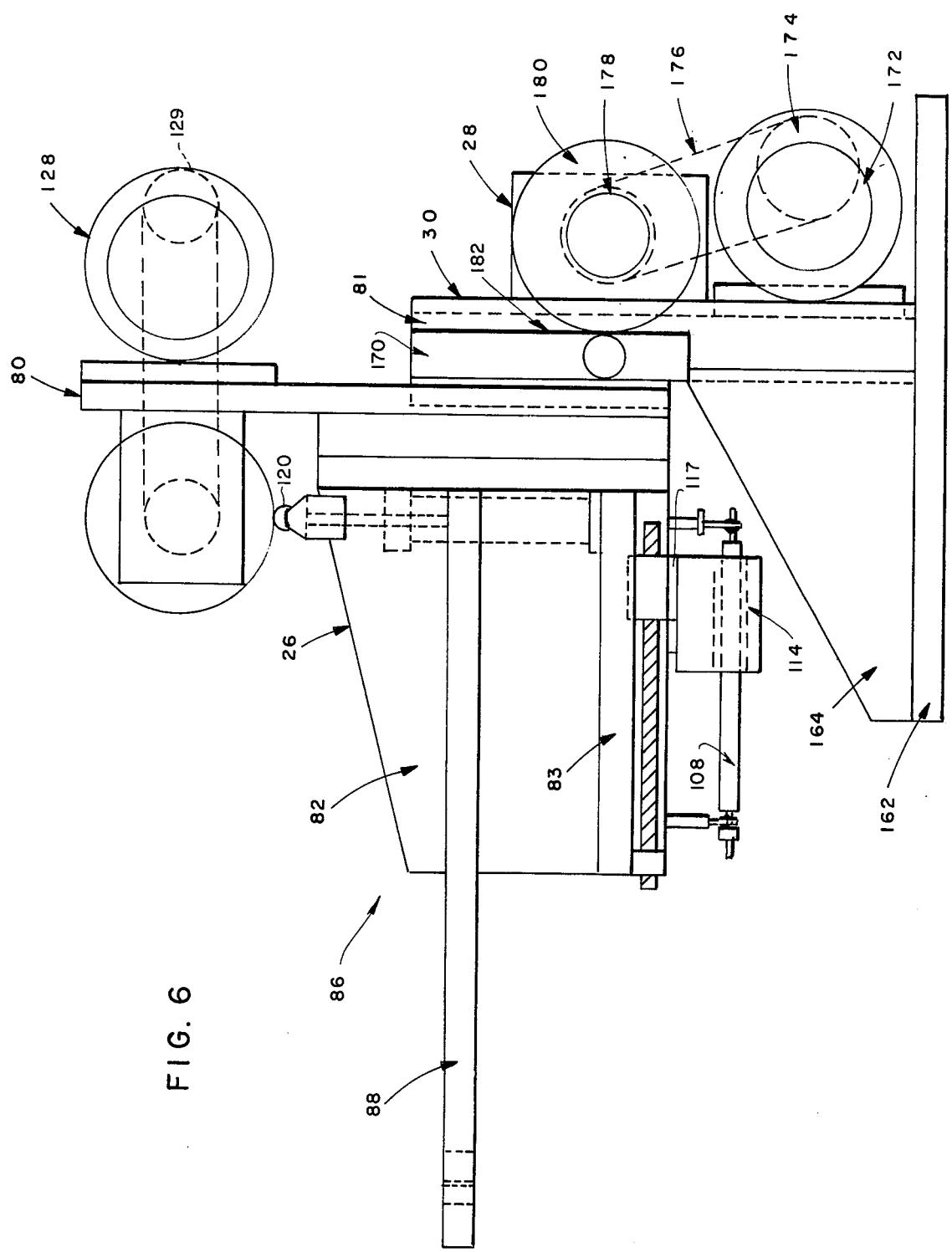
FIG. 6 is a side view of the wobbledrive and mechanical drive subsystems of the bonding system illustrated in FIG. 1.
Figure 7:
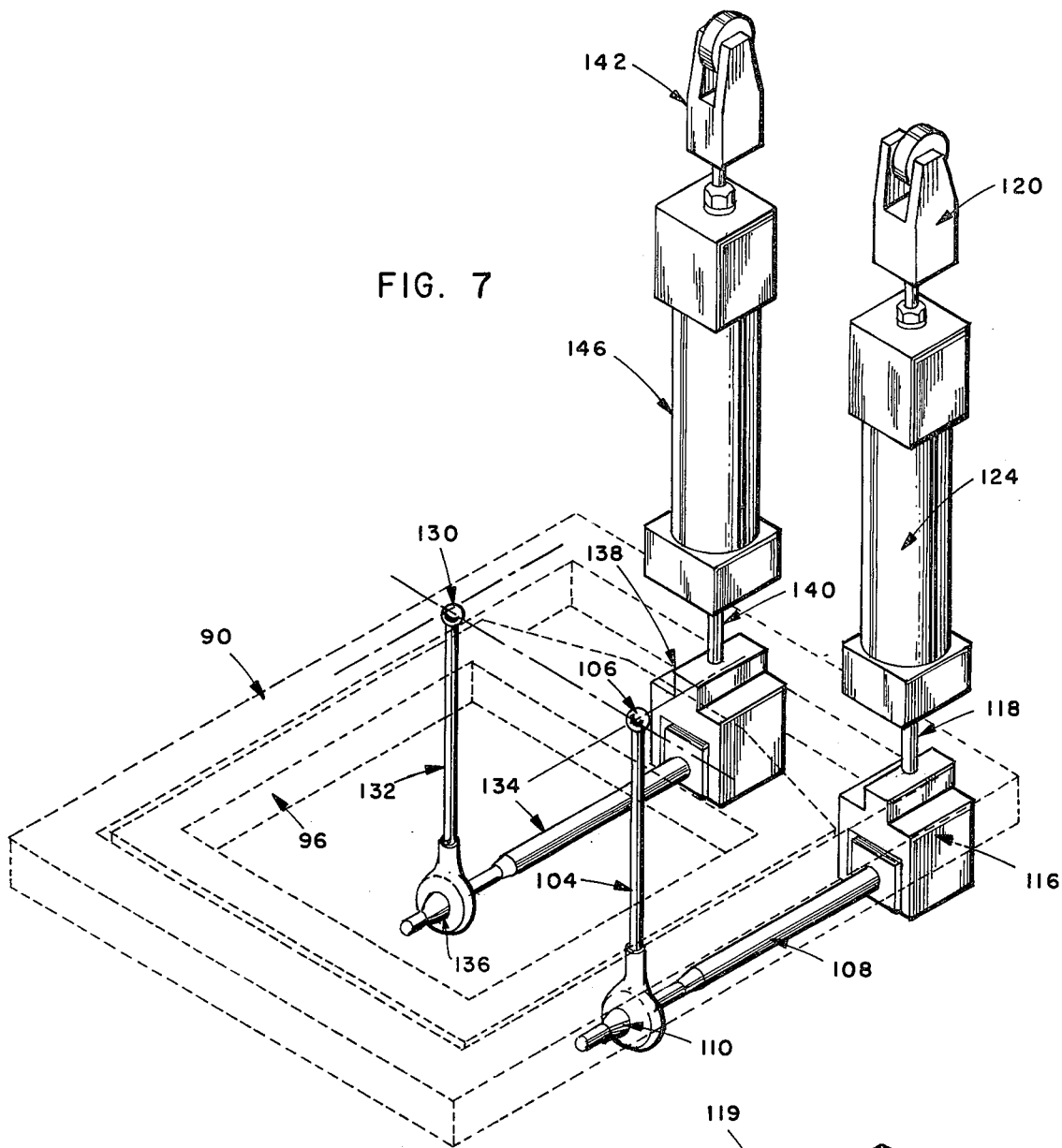
FIG. 7 is a schematic illustration of the gimbal of the present invention.
Figure 9:
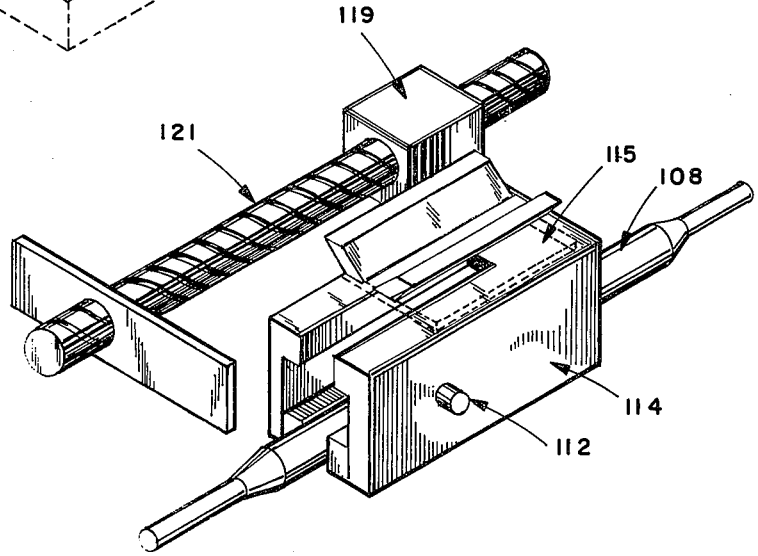
FIG. 9 is a side perspective view of the pivot block assembly of FIG. 7.
Figure 10:
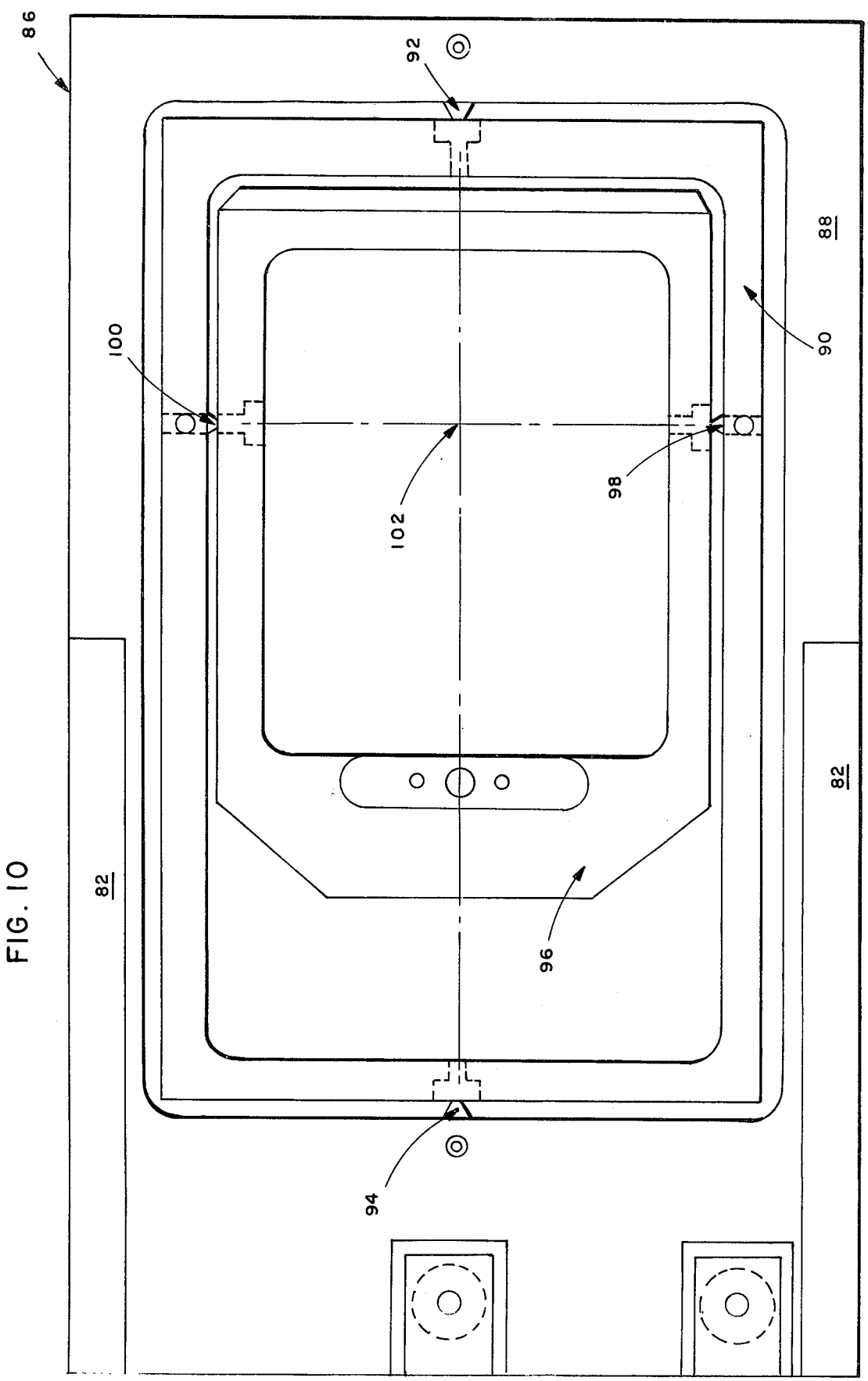
FIG. 10 is a top view of the gimbal mechanism of the present invention.

A particular apparatus for causing bonding tool 22 to move in this fashion is wobble drive system 26., illustrated in FIGS. 6 through 11. As shown in FIG. 6, the wobble drive system 26 is mounted on a vertically oriented backplate 81 on which the entire wobble drive system 26 is moved upward and downward by the mechanical drive system 30 described below. Wobble drive system 26 also has its own back plate 80, and two vertically oriented gussets 82 are mounted on each side of back plate 80, and a base plate 83 is mounted to gussets 82 and back plate 80. A gimbal mechanism 86 is mounted about midway down the back plate 80. Gimbal mechanism 86, as shown in FIGS. 7 and 10, comprises an outer rectangular frame 88 which is fixably mounted to backplate 80 and gussets 82, middle gimbal frame 90 substantially rectangular in shape which is pivotally mounted within outer frame 88 at each end of its longitudinal or y-axis by ball joints 92 and 94 so that middle frame 88 pivots from left to right. An inner gimbal frame 96, also substantially rectangular in shape, is pivotally mounted within the middle gimbal frame 90 by ball joints 98, 100. Inner gimbal frame 96 pivots from front to back, along its x-axis. This pivotal mounting of the two inner gimbal frames 88, 96 could be reversed without affecting the operation of gimbal mechanism 86.

As mentioned previously, the tool holder subsystem 24 is mounted on the rear of inner gimbal frame 96. Thus, as this frame 96 pivots in a rocking or wobbling motion, bonding tool 22, transducer horn 76 and the transducer will also wobble or rock.

Gimbal mechanism 86 is so mounted that when it is lowered on back plate 80 toward the work station 56, it stops when an imaginary intersection point 102, illustrated in FIG. 10, determined by the intersection of two lines connecting pivot points 92, 94 and pivot points 98, 100 coincides as closely as possible with the desired bonding surface. The coincidence of these two points must be the point around which bonding tool 22 will wobble or rock. Bonding tool 22 is adjustably mounted to transducer horn 76 such that its vertical center line is perpendicular to intersection point 102 in the neutral position, and when gimbal mechanism 86 is lowered to the work station 56 the bonding surfaces 70 *a–d* sit on the leads to be bonded.

Referring now to FIGS. 7 and 10 illustrating gimbal mechanism 86, inner gimbal frame 96 is pivotally connected to a vertical shaft 104 attached to its underside by ball joint 106 and connecting to a horizontal shaft 108 by ball joint 110. The length of shaft 104 relative to the side to side deflection of inner gimbal frame 96 is critical to the determination of a rectangular path for bonding tool 22. Horizontal shaft 108 passes through a pivot block 112 (FIG. 9) mounted in movable pivot block frame 114.

Pivot block frame 114 is fixably connected to a horizontal bar 115 slidably mounted to the underside of base plate 80. Bar 115 extends horizontally outward to a threaded nut 119 to which it is fixably connected. Nut 119 is mounted on a bar screw 121 mounted on the underside of base plate 80 parallel to unislide 117. By turning bar screw 121, nut 119 will move forward or backward causing pivot block frame to come forward or backward. Thus the pivot point of pivot block 112 is adjustable along the length of unislide 117, and hence the pivot point of horizontal shaft 108 is adjustable. The other end of horizontal shaft 108 is connected by a ball joint 116 to the bottom of the vertical shaft 118 of cam follower 120. Cam follower 120 is positioned snuggly adjacent to cam 122 (FIG. 8) and held there by air cylinder 124. Cam 122 is a constant velocity cam mounted on cam shaft 126 which is driven by wobble motor 128 through sprocket and chain assembly 129. The vertical movement of cam follower shaft 118 caused by cam 122 is transmitted to horizontal shaft 108 through ball joint 116, and then transmitted through pivot block 112 and ball joint 110 to vertical shaft 104, causing the rise, dwell or fall of vertical shaft 104. Thus, the action of this cam follower 120 will cause inner gimbal frame 96 to pivot from front to back. By positioning pivot block 112 appropriately on horizontal shaft 108, inner gimbal frame 96 can pivot through an arc of 0° to 20°, or as much as 10° above or below the horizontal plane. This causes a corresponding motion in bonding tool 22 which is mounted on inner gimbal frame 96. The shaft 64 of bonding tool 22 is deflected over a range of 20° or as much as 10° to one side of the z-axis.

Figure 11:
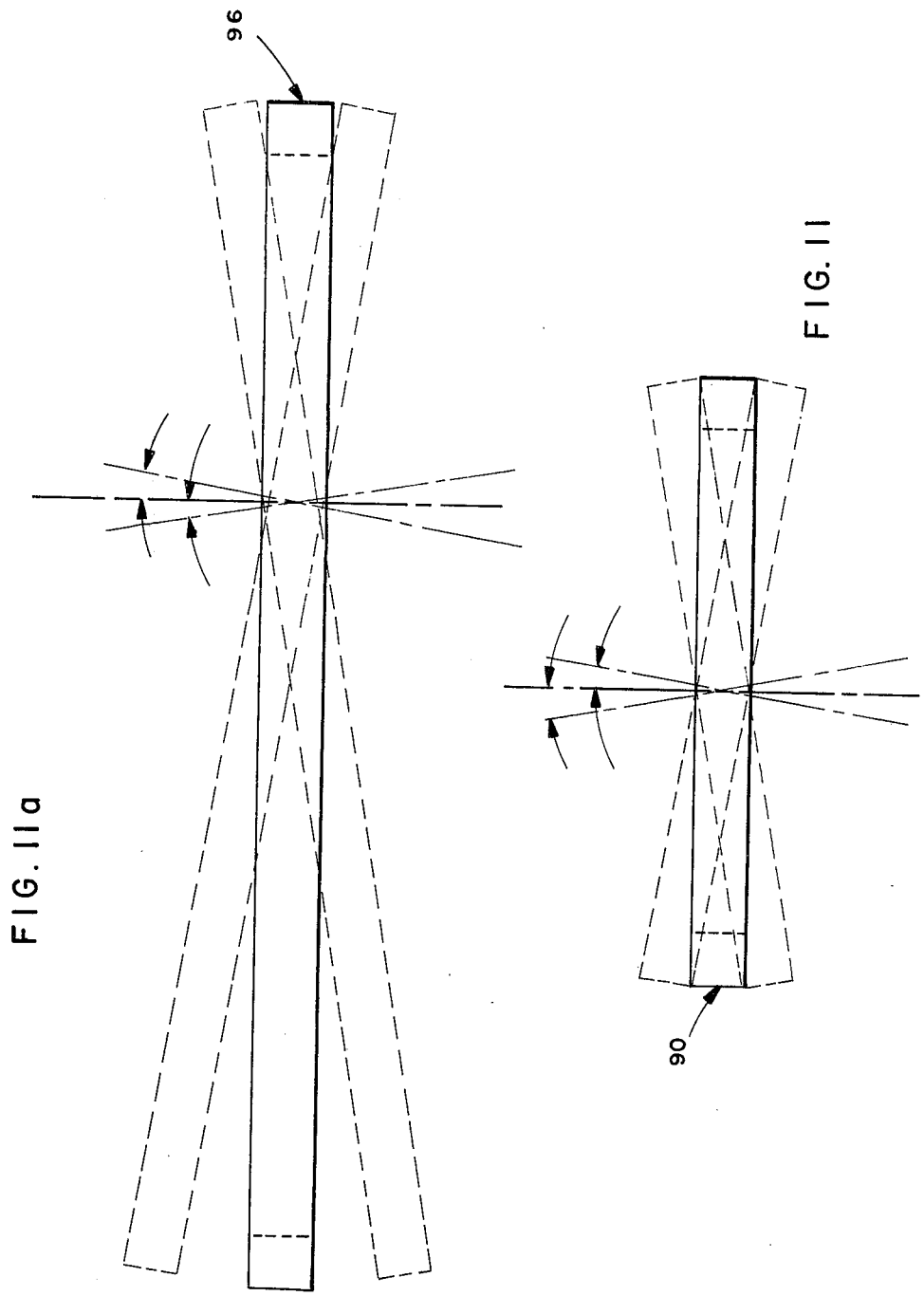
FIG. 11 is an end view of the gimbal illustrating in dotted lines a frame in pivoted positions.

Middle gimbal frame 90 is likewise pivotally connected by ball joint 130 on its underside to a vertical shaft 132 which, in turn, is pivotally connected to horizontal shaft 134 at ball joint 136. Horizontal shaft 134 passes through a second adjustable pivot block 112 in a second pivot block frame 114 to connect pivotally at ball joint 138 with the vertical shaft 140 of cam follower 142 which is held against cam 144 by air cylinder 146. Cam 144 is also mounted on cam shaft 126 and is similar in all respects to cam 122 except that it is ninety degrees out of phase with cam 122. Since horizontal shaft 134 is pivoted by means of cam follower 142, the action of this cam follower will cause middle gimbal frame 90 to pivot from side to side. By positioning this second pivot block 112 appropriately on shaft 134, the middle gimbal frame 90 can pivot through an arc of 0° to 20°, or as much as 10° above or below the horizontal plane, similar to the inner frame but on the x-axis as illustrated in FIGS. 11 and 11 *a*. The combined pivotal movement of middle gimbal frame 90 and inner gimbal frame 96 together with the vertical motion of ball slide 78, as transmitted from cams 122 and 144, one of which is 90° out of phase with the other, will cause bonding tool 22 to rock or wobble in the desired rectangular or other prescribed path. The variable speed of wobble drive motor 128 will compensate for a differing number of leads on each side of the die to be bonded because its speed can be adjusted to permit bonding surfaces 70 *a–d* to spend an equal amount of time over each lead.

The cams 122 and 144 are constant velocity cams. Also mounted on the cam shaft 126 are two small cam wheels 125 and 145 with little protrusions extending outward from their outer circumferential sides. One cam 125 activates a synchronous switch to keep the system in a synchronous movement. The other cam 145 serves as a mode switch to switch the speed of the wobble motor 128 at each corner of the work surface and to turn the ultrasonic energy on and off for each leg of the path of bonding tool 22.

Figure 13:
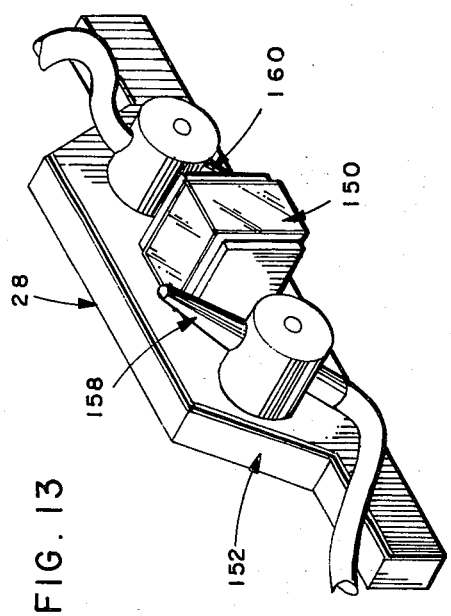
FIG. 13 is a side perspective view of the illuminated optical system of the present invention.

To illuminate the work station 56 and permit operator viewing for alignment and control purposes, optical system 28 is provided. This includes microscope 58 whose viewing area is aligned with the work station 56. Except for microscope 58, the balance of optical system 28 illustrated in FIG. 13, is mounted to the wobble drive system 26. It also includes a prism 150 having one full mirror surface and two half mirror surfaces mounted on a horizontal mounting member 152 which is mounted on the front ends of the fixed plates of two ball slides (not shown) to permit movement of the prism 150 under the gimbal mechanism 86. The movable plates of ball slides are horizontally mounted on the exterior side of gussets 82 below gimbal mechanism 86. Two fiber optic light sources 158, 160 are also mounted on the horizontal prism mounting member 152, one of which is aimed over the prism 150 and the other under the prism 150. Means, (not shown) are provided to move prism 150 and light sources 158, 160 horizontally forward over the station 56 along the y-axis, and to retract it when it is not in use.

Interlock means, (not shown) are provided to insure that both prism 150 and bonding tool 22 are not over the work station 56 surface at the same time. Only when gimbal mechanism 86 is in a raised position, can prism 150 be moved forward over the work station 56 to permit the operator to view the bottom of bonding tool 22 and the top of work station 56 for alignment purposes, either for die pickup or bonding. Upon completion of the alignment process the operator activates a drive means to move prism 150 backwards out of the work area. When prism 150 is fully retracted within upper housing unit 44, a safety switch (not shown) is activated to permit the bonding tool 22 to be lowered to the work station 56.

The mechanical drive system 30, mounted on lower housing member 42 and contained substantially within upper housing member 44, provides the means to lower and raise the bonding tool 22, wobble drive system 26 and optical system 28 to and from the work station 56. Referring now to FIG. 6, which is a side view of drive system 30, base plate 162 serves as the base and two vertically oriented gussets 164 are joined thereto as side support members. A back plate 81 serves as a vertical support member. Back plate 81 is connected to the back plate 80 of the wobble drive system 24 by means of a ball slide 170. A motor 172 is mounted on the rear of back plate 81, which drives a sprocket 174 connected by chain 176 to sprocket 178, which drives gear 180. Gear 180 meshes with rack 182 which is mounted on one side of back plate 80 to drive back plate 80 up or down. A slip clutch (not shown) is associated with gear 180, as a slip clutch. When motor 172 is activated, it causes gear 180 to move the wobble back plate 80, traveling up or down on roller slide 170. As back plate 80 reaches the limit of its upward motion, it encounters a microswitch (not shown) mounted on the one side of back plate 81 and overrides to a stop (not shown) mounted above the microswitch. The microswitch causes motor 172 to stop and hold the wobble system 26 in a raised position. When the wobble system 26 is to be lowered, the operator presses a switch to start motor 172 in reverse and lower this back plate 80. As the wobble system reaches the lower limit of its vertical motion it also encounters a microswitch (not shown) and a stop mounted on the side of wobble back plate 80. This lower microswitch slows motor 172 down so that the tip of bonding tool 22 touches the work surface gently.

There is a slight override in this downward movement, but bonding tool is stopped at the work surface and ball slide 78 compensates for the override. The precise limits of this vertical motion are set by micrometers 184. To support the weight of back plate 80, the wobble system 26 and optics system 28 assemblies mounted thereon, two air cylinders 186 are utilized. Air cylinders 186 serve as springs and the pressure within them is maintained to keep wobble system 26 in a state of equilibrium so that it floats up and down. In the preferred embodiment, the back plate 80 of wobble system 26 has a vertical movement range of about two inches. As mentioned earlier, the work station is at a fixed height over the base of lower housing unit. The wobble and bonding mechanisms 24, 26 are lowered to the work station 56 such that the desired bonding surface coincides with the intersection point 102 of two lines connecting the pivot points 92, 94 and 98, 100 of the middle and inner gimbal frames 90, 96 and tips of bonding surfaces 70 a–d.

The ultrasonic system 32 of the present bonding system comprises a frequency - modulated ultrasonic generator in which the frequency modulation is effected by a saw tooth generator or other desirable modulation wave form such as a sine wave form. This additional signal generator is added in such a fashion that it modulates the frequency of the ultrasonic frequency generator proportional to the applied voltage. Where normally a 60 KHz signal is generated, the added generator would modulate the center frequency from 56 to 64 KHz. This range of modulation can be determined and pre-set. This enables the ultrasonic generator to sweep through resonance a determined and controlled number of times during the time period that a bonding surface 70 a–d is on a lead. Such a controlled frequency modulation is necessary because the resonance characteristics of the transducer will vary with a varying load applied to the transducer caused by the wobbling of bonding tool 22, and because the resonant frequency of individual transducers can vary slightly. With a single frequency system, it is very difficult to obtain a constant energy transfer. However, in the present ultrasonic system, the number of sweeps through resonance on each lead is controlled and hence a constant amount of energy is transferred to each lead. Ultrasonic generator 60 has a normal time duration control omitted, because this function is transferred to the wobble motor 128 speed control, since the number of sweeps through resonance depends on the time of the bonding tool 22 on an individual lead.

The sequence of operations of the system 20 of this invention is as follows. In the start position, the prism 150 is forward, the bonding tool 22 is in a neutral, raised position, and the work table 46 is moved to the right to be in the work area and operator viewing range. The operator aligns the tip 66 of the bonding tool 22 to a die on the die dish 54 and presses a button on the micropositioner 52 to activate the die pick-up process. The prism 150 then moves backward activating a safety switch on the interlock means (not shown) so that the tool 22 will not descend and hit the prism 150. After prism 150 is retracted, the bonding tool 22 then descends to make a contact with the die. The wobble system 26 and head 66 over travel slightly and activate a microswitch which activates the vacuum die pick up. The chip is then held on the tip 66 by the vacuum. The drive system motor 172 then stops, reverses and returns the bonding tool 22 to the start position. Drive system motor 172 now stops and the prism 150 moves forward to assist in the alignment of the bonding tip 66 and chip to the substrate. During the preceeding steps, the die dish 54 has been in the work area and locked in place by a conventional vacuum lock. This lock switch has also locked out the wobble system 26 and the ultrasonic system 32.

The operator now unlocks the vacuum lock on the work table, slides the die dish 54 to the left and the work station 56 to the left such that the work station 56 is approximately centered in the work area. At this point the prism 150 is forward over the work station 56, the bonding tool 22 is in a raised neutral position, and the die dish 54 is to the left, out of the work area. The operator then aligns the bonding tool 22 with the substrate for proper placement of the chip thereon, utilizing the optical system 28 described above and the micropositioner 52. When the alignment is correct the operator pushes a button to activate the next step. The prism 150 moves back, activating the safety switch and drive system motor 172 starts to drive the bonding system downwards to the work station 56. The bonding head 66 starts to come down until the bonding tool 22 comes in contact with the substrate. In the alignment process the bonding tool 22 must be centered over intersection point 102. The descent of the bonding tool 22 stops when bonding surfaces 70 a–d touch the leads to be bonded. Until this time the bonding tool is in neutral position. Having touched the work surface on work station 56, bonding tool 22 moves to the wobble position under the guidance of cams, 122, 144. It first goes to the right rear corner 74a and then proceeds to a wobble cycle with the ultrasonic system 32 turned on at each corner for the movement to the next corner, and then turned off until the tool is ready for the next leg of its path. The bonding tool 22 moves through one complete cycle around the perimeter of the beam lead device. It moves from right rear 74a to left rear 74b, left rear 74b to left front 74c, left front 74c to right front 74d, and right front 74d to right rear 74a. It then returns to the neutral position. The ultrasonic system 32 is firing continuously, though it is possible to stop it at each corner through positive operator control. The speed with which the bonding tool 22 travels may be varied so that each lead receives the same amount of ultrasonic energy. The critical factors in producing a bond are the time the ultrasonic energy is applied to the lead and the pressure of the bonding surfaces 70 a–d. The amount of ultrasonic energy applied to a lead is a function of the time the bonding surface 70 a–d of the bonding tool 22 is on the lead. Hence, the speed along a perimeter can be regulated to allow for an even amount of time on each lead. The pressure is regulated by the weighting system 148 on bonding tool mounting system 24 described earlier.

Figure 15:
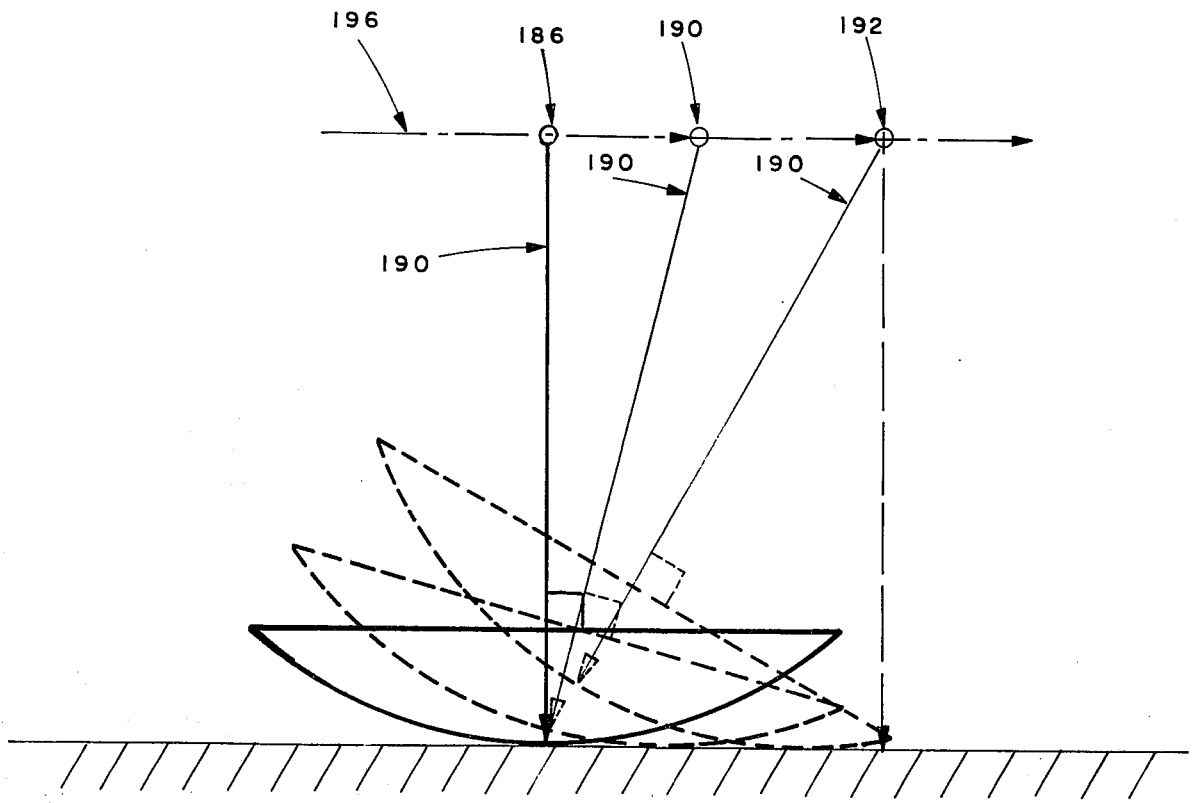
FIG. 15 is a diagram, illustrating in geometric fashion, the rectilinear movement of the bonding tool and tool holder as they wobble over a set of leads.

In FIG. 15, there is a schematic, geometric representation of the wobble movement of bonding tool 22. Line 188 represents the tool holder-transducer horn 76 and line 190 represents the bonding tool 22. Point 186 represents a linkage at the center of the sphere of bonding surfaces 70 a–d. As the gimbal mechanism 86 starts to move, the tool shaft linkage 186 would normally go through an arc which would follow radius R. But since this transducer horn 76 assembly is mounted on a ball slide 78, instead of rotating, transducer horn 76 assembly rises slightly on roller slide 78 and the linkage 186 is actually moving through locus points 190, 192, 194, etc. on line 196, and is following a straight line. This slight motion, combined with the motion of the gimbal mechanism 86 enables bonding surfaces 70 a–d to describe the desired rectangular path. The point 186, representing the center of the sphere of bonding surfaces 70 a–d also travels through the same path as bonding surfaces 70 a–d.

While only a single embodiment of this invention has been specifically disclosed in this specification, it will be obvious to those skilled in the art that many modifications of the disclosed embodiment are possible which would still result in the wobbling movement of the bonding tool in a rectangular path about the perimeter of a semiconductor device. It should also be understood that bonding system 20 can be easily modified to use thermocompression as a source of bonding energy. Accordingly, all such modifications are intended to be included within the scope of this invention.

We claim:

1. A bonding apparatus for bonding electrical leads of beam lead devices and flip chip devices to mating conductive surfaces or a substrate and for bonding electrical leads to contact pads on a semiconductor device comprising:
   a bonding tool having bonding surfaces disposed substantially about the periphery of one end of said tool;
   a tool holder adapted to receive said tool at one end thereof, such that the longitudinal axis of said tool holder is perpendicular to the longitudinal axis of said bonding tool;
   a support member adapted to receive said tool holder;
   slidable mounting means for mounting said tool holder and said support member;
   a gimbal, having outer, middle and inner frames, on which inner frame said slidable mounting means is mounted;
   a motor;
   a cam shaft driven by said motor;
   a plurality of cams mounted on said cam shaft;
   a plurality of cam followers engaged with at least some of said cams;
   a plurality of pivotal shafts connecting said cam followers to said gimbal to cause a pivotal movement of said middle and inner frames;
   a housing in which said gimbal and said motor are mounted;
   table means on said housing to position a semiconductor device under said bonding tool;
   a source of bonding energy for said bonding tool;
   said pivotal movement of said middle and said inner frames of said gimbal causing a wobble movement of said bonding tool along a predetermined adjustable rectangular path about the periphery of one of said semiconductor devices, whereby the bonding surface of said tool sequentially and individually make a bonding contact with each of said electrical leads on each perimeter of said semiconductor devices.

2. The bonding apparatus as defined in claim 1 wherein said motor is a variable speed motor.

3. The bonding apparatus as defined in claim 1 wherein at least two of said cams are ninety degrees out of phase with one another.

4. The bonding apparatus as defined in claim 1 wherein said pivotal shafts connecting said cam followers to said gimbal frames further comprises:
   a vertical cam follower shaft connected to said cam follower;
   a horizontal shaft pivotally connected to said cam follower shaft;
   an adjustable pivot block connected to said horizontal shaft to adjust the pivot point of said horizontal shaft;
   a second vertical shaft connected to said horizontal shaft at one end and pivotally connected to one of said gimbal frames at the other end;
   adjustable means to move said pivot block.

5. A bonding apparatus for use in manufacture of semiconductors for bonding electrical leads of beam lead devices and flip chip devices to mating conductive surfaces on a substrate and for bonding electrical leads to contact pads on a semiconductor device comprising:
   a bonding tool having bonding surface disposed around its periphery;
   a tool holder;
   slidable mounting means for mounting said tool and tool holder on a gimbal;
   a gimbal having a fixed outer frame, a middle frame pivoting on one axis and an inner frame pivoting on the other axis;
   a vertical shaft pivotally connected to each of said pivoting gimbal frames;
   a horizontal shaft pivotally connected to each of said vertical shafts;
   an adjustable pivot block for each of said horizontal shafts through which said horizontal shafts pass to adjust the pivot points of each of said horizontal shafts;
   a cam follower shaft pivotally attached to each of said horizontal shafts;

a cam follower mounted on each of said cam follower shafts;
a plurality of cams, some of which are in contact with said cam followers, and at least two of which are ninety degrees out of phase with one another;
a cam shaft on which said cams are mounted;
a motor driving said cam shaft;
a plurality of cams controlling said motor;
a movable mounting means for said gimbal, said cam shaft, said cam motor and said means for moving said pivot block;
a drive means including a motor for driving said movable mounting means;
a housing for said movable mounting means and said drive means;
said drive means moving said bonding tool into and out of a work area wherein are placed semiconductors in the manufacturing process;
illuminated optical means for an operator to view and align said bonding tool to said semiconductors;
a source of bonding energy for supplying bonding energy to the bonding surfaces of said bonding tool;
means to control said source of bonding energy such that it is applied only when said apparatus is bonding.

6. A bonding apparatus for bonding electrical leads of a semiconductor device to a pattern of conductors on a carrier comprising:
a housing;
a tool holder mounted on said housing for movement relative thereto;
a bonding tool attached to one end of the tool holder in radial alignment therewith such that the longitudinal axis of said bonding tool is approximately perpendicular to the longitudinal axis of said tool holder;
a plurality of bonding surfaces on said bonding tool for engaging the electrical leads of a semiconductor device;
wobble drive means mounted on said housing engaging said tool holder remote from said plurality of bonding surfaces for moving said tool on a predetermined, adjustable tilted axis to cause the bonding surface of said bonding tool to engage and bond sequentially the electrical leads of a semiconductor device in a predetermined, adjustable path around the periphery of the semiconductor device;
a source of bonding energy for said bonding tool comprising an ultrasonic generator producing a range of frequencies including a center frequency; and
an ultrasonic transducer mounted on said tool holder in a radial alignment with said bonding tool, the longitudinal axis of said transducer being approximately perpendicular to the longitudinal axis of said bonding tool for transmitting ultrasonic energy from said ultrasonic generator to said bonding tool whereby said transducer wobbles along with said bonding tool, said generator further including means for modulating the wave form of the center frequency of said ultrasonic generator in a predetermined manner such that said generator will sweep through resonance a determined number of times during the time period in which the bonding surface of said tool is engaging an electrical lead of a semiconductor device.

7. The bonding apparatus for bonding electrical leads of a semiconductor device to a pattern of conductors on a carrier comprising:
a housing;
a tool holder mounted on said housing for movement relative thereto;
a bonding tool attached to one end of the tool holder in a radial alignment therewith such that the longitudinal axis of said bonding tool is approximately perpendicular to the longitudinal axis of said tool holder;
a source of bonding energy for said bonding tool;
a plurality of said bonding surfaces on said bonding tool for engaging the electrical leads of a semiconductor device;
wobble drive means mounted on said housing engaging said tool holder remot from said plurality of bonding surfaces for moving said tool on a predetermined, adjustable tilted axis to cause the bonding surface of said bonding tool to engage and bond sequentially the electrical leads of a semiconductor device, said wobble drive means comprising:
a gimbal mechanism having a pivotal frame;
means to cause an adjustable pivotal movement of said gimbal mechanism;
a variable speed motor to drive and control said means to cause the adjustable pivotal movement of said gimbal mechanism;
a cam shaft driven by said wobble drive variable speed motor;
a plurality of interchangeable cams mounted on said cam shaft for defining and controlling the pivotal movements of said gimbal mechanism;
a plurality of cams mounted on said cam shaft for synchronizing the pivotal movement of said gimbal mechanism and the dispensing of bonding energy during the wobbling movement of said bonding tool;
and wherein said tool holder is mounted on a ball slide mounted on said pivotal frame of said gimbal mechanism.

8. A bonding apparatus as defined in claim 7 wherein the wobble drive mechanism further comprises:
an adjustable pivot block for controlling the pivotal movement of said gimbal mechanism along both an x-axis and a y-axis and which may be adjusted to eliminate said wobble movement completely, thereby permitting said bonding apparatus to be used as a flip chip bonder bonding all leads simultaneously;

9. A bonding apparatus as defined in claim 7 wherein said wobble drive means further comprises:
a series of pivotally connected shafts terminating at a cam follower at one end and a frame of said gimbal mechanism at the other end.

10. The bonding apparatus as defined in claim 7 wherein said bonding tool further comprises:
a vertical shaft adapted to be adjustably held in a tool holder;
a bonding head at one end of said shaft;
a hollow recess in one end of said bonding head;
a plurality of curved bonding surfaces substantially disposed around the periphery of said bonding head, said bonding surfaces being minute sections of a sphere whose radius is equivalent to the distance from the surface to the center of said shaft in said tool holder.

* * * * *